(12) United States Patent
Sawlani et al.

(10) Patent No.: US 10,895,539 B2
(45) Date of Patent: Jan. 19, 2021

(54) IN-SITU CHAMBER CLEAN END POINT DETECTION SYSTEMS AND METHODS USING COMPUTER VISION SYSTEMS

(71) Applicant: LAM RESEARCH CORPORATION, Fremont, CA (US)

(72) Inventors: Kapil Sawlani, San Jose, CA (US); Gary B. Lind, Penn Valley, CA (US); Michal Danek, Cupertino, CA (US); Ronald Powell, Portola Valley, CA (US); Michael Rumer, Santa Clara, CA (US); Kaihan Ashtiani, Cupertino, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 197 days.

(21) Appl. No.: 16/139,703

(22) Filed: Sep. 24, 2018

(65) Prior Publication Data

US 2019/0120775 A1 Apr. 25, 2019

Related U.S. Application Data

(60) Provisional application No. 62/575,190, filed on Oct. 20, 2017.

(51) Int. Cl.
| | |
|---|---|
| *G06T 7/00* | (2017.01) |
| *G01N 21/956* | (2006.01) |
| *G02B 5/20* | (2006.01) |
| *G06F 17/15* | (2006.01) |
| *G06N 20/00* | (2019.01) |
| *H01L 21/66* | (2006.01) |

(52) U.S. Cl.
CPC ....... *G01N 21/95607* (2013.01); *G02B 5/208* (2013.01); *G06F 17/15* (2013.01); *G06N 20/00* (2019.01); *G06T 7/001* (2013.01); *H01L 22/12* (2013.01); *H01L 22/26* (2013.01); *G06T 2207/30148* (2013.01)

(58) Field of Classification Search
CPC .. G01N 21/95607; G06N 20/00; G02B 5/208; G06F 17/15; G06T 7/001; G06T 2207/30148; H01L 22/12; H01L 22/02
USPC ......................................................... 382/141
See application file for complete search history.

(56) References Cited

U.S. PATENT DOCUMENTS

| | | | | |
|---|---|---|---|---|
| 2001/0025972 A1* | 10/2001 | Moriwaki | ......... | H01L 21/28088 257/296 |
| 2002/0094691 A1* | 7/2002 | Yokogawa | ........ | H01J 37/32192 438/710 |
| 2004/0053472 A1* | 3/2004 | Kiryu | .................. | H01L 21/3141 438/287 |

(Continued)

*Primary Examiner* — Ali Bayat

(57) ABSTRACT

A system includes a camera mounted external to and adjacent to a window of a processing chamber configured to process semiconductor substrates. The window allows the camera to view a component in the processing chamber. The camera is configured to generate a video signal indicative of a status of the component during a process being performed in the processing chamber. The system further includes a controller coupled to the processing chamber. The controller is configured to control the camera, process the video signal from the camera, determine the status of the component based on the processing of the video signal, and determine whether to terminate the process based on the status of the component.

15 Claims, 12 Drawing Sheets

(56) References Cited

U.S. PATENT DOCUMENTS

| | | | |
|---|---|---|---|
| 2004/0086171 A1* | 5/2004 | Jun | H01L 21/67253 382/149 |
| 2012/0307233 A1* | 12/2012 | Boguslavskiy | G01N 21/71 356/43 |
| 2013/0273746 A1* | 10/2013 | Kawato | H01L 21/67017 438/758 |
| 2016/0089688 A1* | 3/2016 | Uemae | H01L 21/67051 216/85 |

* cited by examiner

IN-SITU CHAMBER CLEAN END POINT DETECTION SYSTEMS AND METHODS USING COMPUTER VISION SYSTEMS

CROSS-REFERENCE TO RELATED APPLICATIONS

This application claims the benefit of U.S. Provisional Application No. 62/575,190, filed on Oct. 20, 2017. The entire disclosure of the application referenced above is incorporated herein by reference.

FIELD

The present disclosure relates to substrate processing systems, and more particularly to detection systems and methods for detecting an end point of residual film removal using a computer vision system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to perform treatments such as deposition and etching of film on substrates such as semiconductor wafers. For example, deposition may be performed to deposit conductive film, dielectric film or other types of film using chemical vapor deposition (CVD), atomic layer deposition (ALD) or other deposition processes. During deposition, one or more precursor gases may be supplied to a processing chamber during one or more process steps. Plasma may be used to initiate chemical reactions.

After deposition is performed, the process gases are evacuated and the substrate is removed from the processing chamber. While film is deposited on the substrate, it is also deposited on components located in the processing chamber. Over time, residual film builds up on these components and needs to be removed to prevent particle contamination, mechanical deformation, and/or substrate defects. A chamber cleaning process is periodically performed to remove the residual film from the components in the processing chamber.

Currently, fixed time cleaning processes are used. Verification of the cleaning is performed manually using a chamber view port or using chemical sensors such as infrared absorption detectors and/or residual gas analyzers (RGAs). Timed-based cleaning requires manual verification that the processing chamber state is clean. Another limitation of this approach is the inability to predict cleaning times when process or hardware changes occur. Any modification to the process recipe or chamber configuration can result in different accumulation of the residual film and different etch rates of the chamber cleaning process. This results in varying clean times which need to be manually characterized.

The chemical sensors are typically expensive and may have limited application. For example, infrared absorption detectors are usually limited to a particular gas species. RGAs are also limited to a particular atomic mass that the detector can analyze.

SUMMARY

A system comprises a camera mounted external to and adjacent to a window of a processing chamber configured to process semiconductor substrates. The window allows the camera to view a component in the processing chamber. The camera is configured to generate a video signal indicative of a status of the component during a process being performed in the processing chamber. The system further comprises a controller coupled to the processing chamber. The controller is configured to control the camera, process the video signal from the camera, determine the status of the component based on the processing of the video signal, and determine whether to terminate the process based on the status of the component.

In other features, in response to the process being a cleaning process performed to remove material deposited on the component by a previously performed process, the controller is configured to compare a change in an attribute of a feature of the component observed over a plurality of frames of the video signal to a predetermined threshold; determine, based on the comparison, whether the material deposited on the component is removed; and terminate the cleaning process in response to determining that the material deposited on the component is removed.

In other features, in response to the process being a cleaning process performed to remove material deposited on the component by a previously performed process, the controller is configured to compare an image captured from the video signal to a predetermined image; determine, based on the comparison, whether the material deposited on the component is removed; and terminate the cleaning process in response to determining that the material deposited on the component is removed.

In other features, the controller is configured to receive data from one or more sensors in the processing chamber; and generate a model based on the data received from one or more sensors and video signals received from the camera, the video signals indicating the status of the component while the process is previously performed in the processing chamber. The controller is further configured to use the model to process the video signal; determine the status of the component based on the processing of the video signal; and determine whether to terminate the process based on the determined status of the component.

In other features, the system further comprises an optical filter arranged between the camera and the window. The optical filter is configured to filter one or more wavelengths of light received from the component through the window and to output a filtered signal to the camera. The controller is configured to determine the status of the component based on processing the filtered signal using optical interference.

In another feature, the controller is configured to determine whether the process is performed across an entirety of the component prior to terminating the process.

In another feature, the controller is configured to determine whether the process is performed uniformly across an entirety of the component prior to terminating the process.

In another feature, the controller is configured to determine a rate at which the process is being performed at different locations on the component.

In another feature, the component includes a semiconductor substrate, and the process includes a film removal process performed to remove a film from the semiconductor substrate. The controller is configured to determine whether film is removed across an entirety of the component prior to terminating the process.

In another feature, the controller is configured to focus the camera at an edge of the component and to determine whether the process is performed at the edge of the component prior to terminating the process.

In other features, the component includes a semiconductor substrate, and the process includes a deposition process. The system further comprises a first optical filter arranged between the camera and the window. The first optical filter is configured to filter wavelengths of ultraviolet light received from the component through the window. The system further comprises a second optical filter arranged between the camera and the window. The second optical filter is configured to filter wavelengths of infrared light received from the component through the window. The controller is configured to determine a thickness of material being deposited at a plurality of locations on the component based on an output of the first optical filter; determine a temperature of the component at the plurality of locations based on an output of the second optical filter; correlate the determinations of the thickness and the temperature; and determine a uniformity of deposition across an entirety of the component based on the correlation.

In other features, the component includes a semiconductor substrate, and the process includes a deposition process. The system further comprises an optical sensor configured to view a bottom portion of the component. The controller is configured to focus the camera at a top portion of the component; process images received from the optical sensor and the camera; and determine uniformity of deposition across entireties of the top portion and the bottom portion of the component based on the processing of the images.

In other features, the system further comprises a second controller coupled to a second processing chamber in which the same process is performed. The second controller is configured to control a second camera associated with the second processing chamber. The system further comprises a third controller configured to analyze data from the controller and the second controller; compare, based on the analyzed data, the performance of the process in the processing chamber to the performance of the process in the second processing chamber; and determine, based on the comparison, whether the performance of the process in the processing chamber matches the performance of the process in the second processing chamber.

In other features, the system further comprises a second controller coupled to a second processing chamber in which the same process is performed on the same component. The second controller is configured to control a second camera associated with the second processing chamber. The system further comprises a third controller configured to analyze data from the controller and the second controller; compare, based on the analyzed data, the performance of the process on the component in the processing chamber and in the second processing chamber; and determine, based on the comparison, whether the performance of the process on the component in the processing chamber matches the performance of the process on the component in the second processing chamber.

In other features, in response to the process in the processing chamber finishing earlier than in the second processing chamber, the third controller is configured to terminate the process in the processing chamber earlier than in the second processing chamber.

In still other features, a method comprises controlling a camera mounted external to and adjacent to a window of a processing chamber configured to process semiconductor substrates. The window allows the camera to view a component in the processing chamber. The method further comprises generating using the camera, a video signal indicative of a status of the component during a process being performed in the processing chamber; determining the status of the component based on the video signal; and determining whether to terminate the process based on the status of the component.

In other features, the process includes a cleaning process performed to remove material deposited on the component by a previously performed process, and the method further comprises comparing a change in an attribute of a feature of the component observed over a plurality of frames of the video signal to a predetermined threshold; determining, based on the comparison, whether the material deposited on the component is removed; and terminating the cleaning process in response to determining that the material deposited on the component is removed.

In other features, the process includes a cleaning process performed to remove material deposited on the component by a previously performed process, and the method further comprises comparing an image captured from the video signal to a predetermined image; determining, based on the comparison, whether the material deposited on the component is removed; and terminating the cleaning process in response to determining that the material deposited on the component is removed.

In other features, the method further comprises receiving data from one or more sensors in the processing chamber; and generating a model based on the data received from one or more sensors and video signals received from the camera. The video signals indicate the status of the component while the process is previously performed in the processing chamber. The method further comprises, using the model, processing the video signal; determining the status of the component based on the processing of the video signal; and determining whether to terminate the process based on the determined status of the component.

In other features, the method further comprises filtering one or more wavelengths of light received from the component through the window, and determining the status of the component based on the filtering using optical interference.

In another feature, the method further comprises determining whether the process is performed across an entirety of the component prior to terminating the process.

In another feature, the method further comprises determining whether the process is performed uniformly across an entirety of the component prior to terminating the process.

In another feature, the method further comprises determining a rate at which the process is being performed at different locations on the component.

In other features, the component includes a semiconductor substrate, and the process includes a film removal process performed to remove a film from the semiconductor substrate. The method further comprises determining whether film is removed across an entirety of the component prior to terminating the process.

In other features, the method further comprises focusing the camera at an edge of the component, and determining whether the process is performed at the edge of the component prior to terminating the process.

In other features, the component includes a semiconductor substrate, and the process includes a deposition process. The method further comprises filtering wavelengths of ultraviolet light received from the component through the window; filtering wavelengths of infrared light received from the component through the window; determining a thickness of material being deposited at a plurality of locations on the component based on the filtering of wavelengths of ultraviolet light; determining a temperature of the component at the plurality of locations based on the filtering of wavelengths of infrared light; correlating the determinations of the thickness and the temperature; and determining a uniformity of deposition across an entirety of the component based on the correlation.

In other features, the component includes a semiconductor substrate, and the process includes a deposition process. The method further comprises viewing, using an optical sensor, a bottom portion of the component; focusing the camera at a top portion of the component; processing images received from the optical sensor and the camera; and determining uniformity of deposition across entireties of the top portion and the bottom portion of the component based on the processing of the images.

In other features, the method further comprises receiving data from a second camera associated with a second processing chamber in which the same process is performed; analyzing data from the processing chamber and the second processing chamber; comparing, based on the analyzed data, the performance of the process in the processing chamber to the performance of the process in the second processing chamber; and determining, based on the comparison, whether the performance of the process in the processing chamber matches the performance of the process in the second processing chamber.

In other features, the method further comprises receiving data from a second camera associated with a second processing chamber in which the same process is performed on the same component; analyzing data from the processing chamber and the second processing chamber; comparing, based on the analyzed data, the performance of the process on the component in the processing chamber and in the second processing chamber; and determining, based on the comparison, whether the performance of the process on the component in the processing chamber matches the performance of the process on the component in the second processing chamber.

In other features, in response to the process in the processing chamber finishing earlier than in the second processing chamber, the method further comprises terminating the process in the processing chamber earlier than in the second processing chamber.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to systems and methods for detecting the end point of residual film removal using a computer vision system. The systems and methods utilize a camera mounted outside of the processing chamber adjacent to a window into the processing chamber. The camera operates in visible and/or infrared wavelength ranges and produces a video signal (as used herein, the term video signals also includes a series of still pictures taken at predetermined intervals). The video signal generated by the camera is processed and analyzed by the computer vision system to determine when the end point of the residual film removal is reached.

In some examples, the end point is identified based on detected changes to features of components in the processing chamber such as shape or edge identification, contrast, color, brightness or other features. For example, the computer vision system may compare one or more attributes of one or more features from one frame to another, differences over multiple frames, or differences over a rolling window of frames to one or more predetermined thresholds. In other examples, the end point is identified when markings (made on the components below the residual film) become exposed with sufficient clarity.

In some examples, the computer vision system uses a learned model (such as a neural network or other deep learning model) that is trained using the video signals and a chemical sensor such as an absorption sensor or an RGA sensor. During learning, the learned model identifies one or more attributes that are indicator(s) of the end point. Once the learned model is generated, the chemical sensor is no longer needed.

Figure 1:
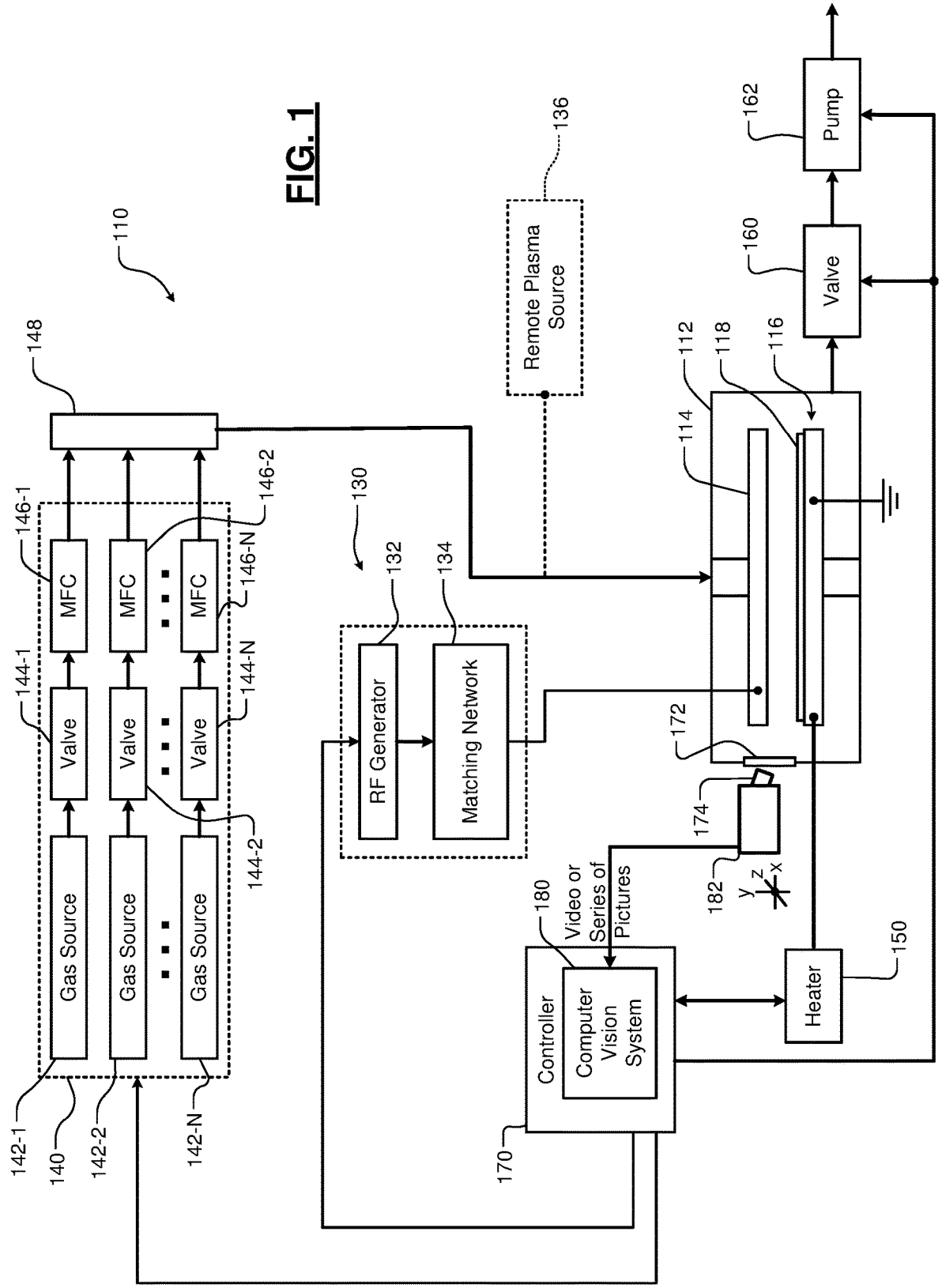
FIG. 1 is a functional block diagram of an example of a substrate processing system for generating video signals and using a computer vision system to detect an end point for residual film removal based on the video signals according to the present disclosure.

Referring now to FIG. 1, an example of a substrate processing system for performing substrate treatment such as deposition is shown. A substrate is arranged in the processing chamber and substrate treatment such as deposition is performed. The substrate is removed and one or more additional substrates are treated. Over time, residual film or other material builds up on components such as side walls, a substrate support, a gas distribution device, etc. that are located within the processing chamber. Cleaning is performed periodically to remove residual film or other material deposited on components in the processing chamber. In one example, nitrogen trifluoride ($NF_3$) remote plasma is used during cleaning. While specific examples of substrate processing systems and processes are shown and described, other substrate processing systems and processes can be used. For example, throughout the present disclosure, cleaning is described as a plasma process for example only. Instead, cleaning can be a chemical process. For example, instead of using plasma for cleaning, the cleaning described herein can be performed using $ClF_3$. The teachings of the present disclosure apply equally when a chemical process is used instead of plasma for cleaning.

A substrate processing system 110 in FIG. 1 includes a processing chamber 112 that encloses other components of the substrate processing system 110 and contains the RF plasma (if used for a particular substrate treatment). The substrate processing system 110 includes a showerhead 114 or other gas distribution device and a substrate support assembly 116. A substrate 118 is arranged on the substrate support assembly 116. The showerhead 114 introduces and distributes process gases.

If plasma is used, the plasma used during substrate treatment or cleaning can be direct or remote plasma. In one example, an RF generating system 130 generates and outputs an RF voltage to either the showerhead 114 or the substrate support assembly 116 (the other is DC grounded, AC grounded or floating). For example only, the RF generating system 130 may include an RF voltage generator 132 that generates the RF voltage that is fed by a matching network 134 to the showerhead 114 or the substrate support assembly 116. In some examples, in-situ plasma is used during substrate treatment and remote plasma is delivered during cleaning.

A gas delivery system 140 includes one or more gas sources 142-1, 142-2, . . . , and 142-N (collectively gas sources 142), where N is an integer greater than zero. The gas sources 142 supply one or more etch gas mixtures, precursor gas mixtures, cleaning gas mixtures, ashing gas mixtures, etc. to the processing chamber 112. Vaporized precursor may also be used. The gas sources 142 are connected by valves 144-1, 144-2, . . . , and 144-N (collectively valves 144) and mass flow controllers 146-1, 146-2, . . . , and 146-N (collectively mass flow controllers 146) to a manifold 148. An output of the manifold 148 is fed to the processing chamber 112. For example only, the output of the manifold 148 is fed to the showerhead 114.

A heater 150 may be connected to a heater coil (not shown) arranged in the substrate support assembly 116. The heater 150 may be used to control a temperature of the substrate support assembly 116 and the substrate 118. A valve 160 and pump 162 may be used to evacuate reactants from the processing chamber 112. A controller 170 may be used to control components of the substrate processing system 110. For example only, the controller 170 may be used to control flow of process gases, monitoring of process parameters such as temperature, pressure, power, etc., striking and extinguishing plasma, removal of reactants, etc.

The processing chamber 112 includes one or more windows 172 located on one or more surfaces of the processing chamber 112. One or more cameras 174 generate video signals of the substrate support assembly 116, the substrate or other chamber components.

The controller 170 includes a computer vision system 180 that receives one or more video signals from the camera 174. The computer vision system 180 identifies the end point of residual film removal based thereon. While a single camera 174 is shown, one or more additional cameras 174 can be used. In some examples, a camera positioning device 182 adjusts a position of the camera 174 to change a field of view of the camera 174. In some examples, the controller 170 may be used to change the position of the camera 174 before, during or after the end point of residual film removal is detected. In some examples, one or more filters are arranged between the camera 174 and the processing chamber to filter one or more wavelengths or wavelength ranges.

In some examples, the computer vision system 180 determines differences in visual characteristics of the video to identify the end point of residual film removal. For example, the computer vision system 180 may compare color, brightness and/or contrast levels from one frame to another, a difference over multiple frames, or differences over a rolling window of frames.

In other examples, the computer vision system 180 detects the end point of residual film removal by sufficiently identifying markings located on one or more components in the processing chamber. As the residual film is removed from the one or more components during cleaning, characteristics such as edges, color, patterns and/or an overall shape of the markings will become clearer. The captured images can be compared to predetermined images using a correlation function. Detection can be triggered when the calculated correlation values exceeds a predetermined threshold. The end point can be determined when a predetermined event occurs or the predetermined event can be used to start a timer after which the end point can be declared.

In still other examples, a learned model may be trained using chemical sensors such as absorption sensors or RGA sensors and the video signals. Once trained, the learned model detects the endpoint based on the video signals and does not need to use the chemical sensors as will be described further below.

Figure 2:
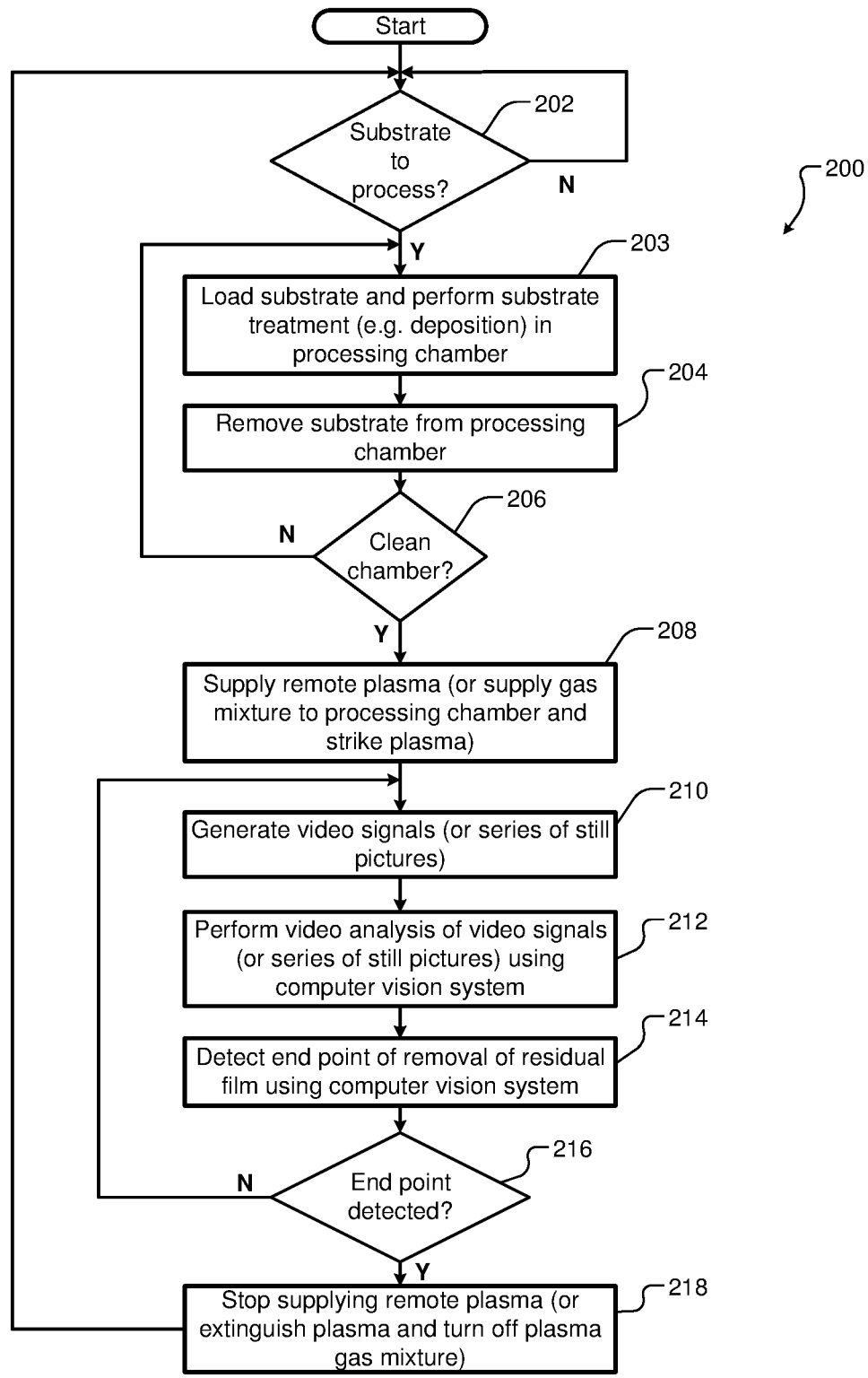
FIG. 2 is a flowchart illustrating an example of a method for operating the substrate processing system of FIG. 1 according to the present disclosure.

Referring now to FIG. 2, a method 200 for using a video signal and a computer vision system to detect the endpoint of residual film removal is shown. At 202, if a substrate needs to be processed, the method continues at 203. At 203, the substrate is loaded into the processing chamber and a substrate treatment such as deposition is performed.

At 204, the substrate is removed from the processing chamber after the substrate treatment is performed. At 206, the method determines whether the chamber requires cleaning. If 206 is false, the method returns to 202. If 206 is true, the method continues at 208 and supplies remote plasma (or supplies a gas mixture to the processing chamber and strikes plasma). If in-situ plasma is used, a filter may be arranged between the video camera and the processing chamber.

At 210, video signals are generated during the cleaning process. At 212, the computer vision system performs video analysis of the video signals. At 214, the computer vision system processes the video signals and detects the endpoint of film removal. At 216, the method determines whether the endpoint has been detected. If 216 is false, the method returns to 210. When 216 is true, the method continues at 218 and stops supplying remote plasma (or extinguishes the plasma and turns off the plasma gas mixture). The method continues from 218 to 202.

Figure 3:
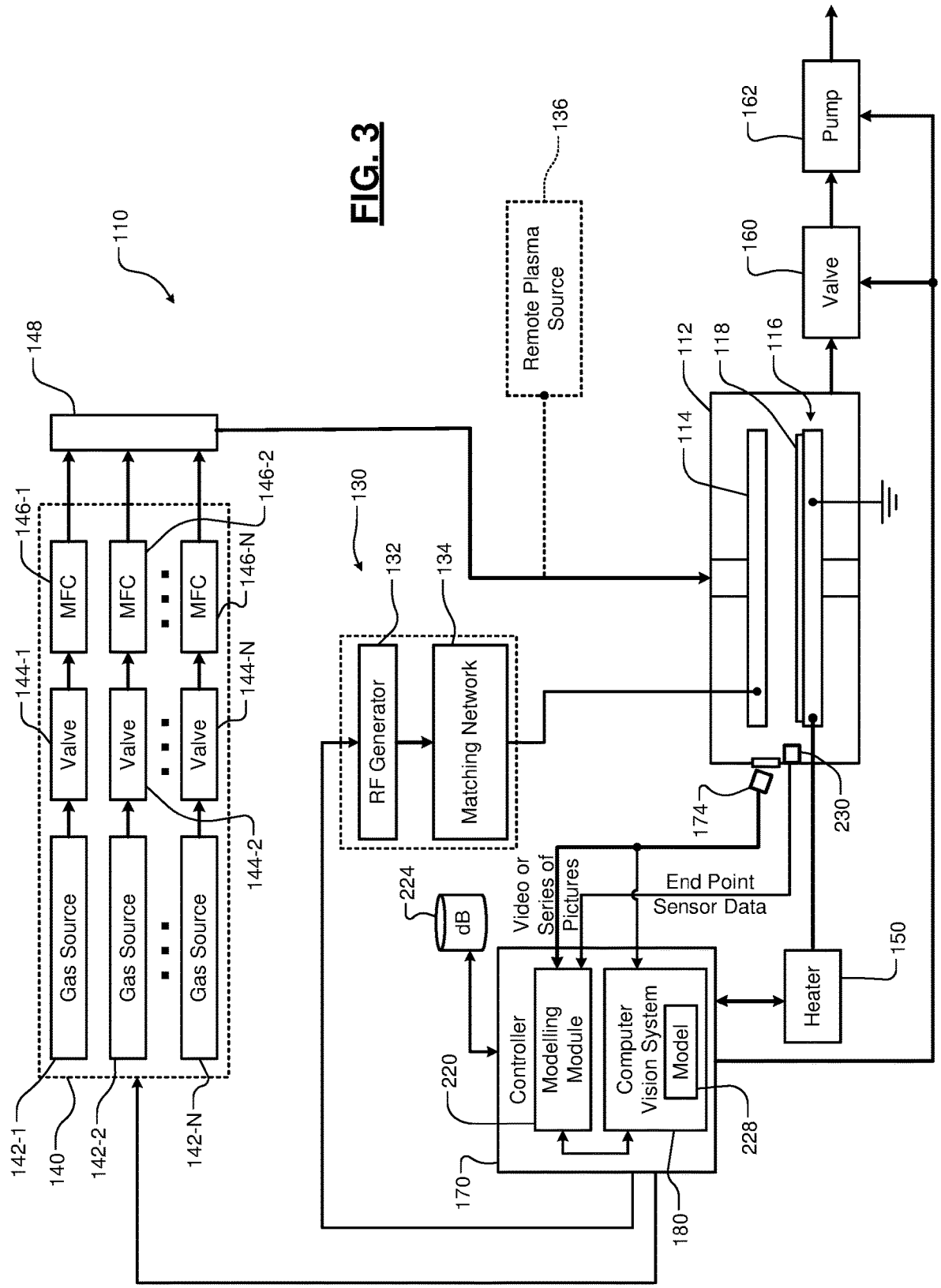
FIG. 3 is a functional block diagram of an example of a substrate processing system for gathering sensor data to generate a learned model that is used by the computer vision system to identify the end point of residual film removal according to the present disclosure.

Referring now to FIG. 3, a learned model can be generated and used to detect the end point of residual film removal. A modelling module 220 generates a learned model to be used by the computer vision system 180. The learned model is generated based on the training data including the video signals and an output of a chemical sensor 230 such as an absorption or RGA sensor. While a specific location is shown, the chemical sensor can be arranged in other locations such as in the exhaust. While the modelling module 220 is shown located in the controller 170, the modelling module 220 can be located in another computer (not shown) during model generation and the model can be transmitted to and/or stored in the controller 170.

The modelling module 220 identifies features in the video signal that are indicators of the end point using a plurality of sets of training data. In some examples, the plurality of sets of training data is stored in a local or remote database 224. Once the learned model is generated, the learned model can be loaded into the controller 170 (as shown at 228) and the chemical sensor 230 is no longer needed.

In some examples, the learned model includes a supervised learning model selected from a group consisting of linear models, support vector machine models, decision tree models, random forest models and Gaussian models. However, the present disclosure is not limited to supervised learning. Additionally or alternatively, unsupervised learning may be used. In other examples, the learned model employs principal component analysis (PCA), neural networking, autoencoding, regression analysis, and/or partial least squares (PLS). For example, neural networking may utilize a convolutional neural network (CNN), a recurrent neural network (RNN), reinforcement learning (reward based model), and/or other methods.

Figure 4:
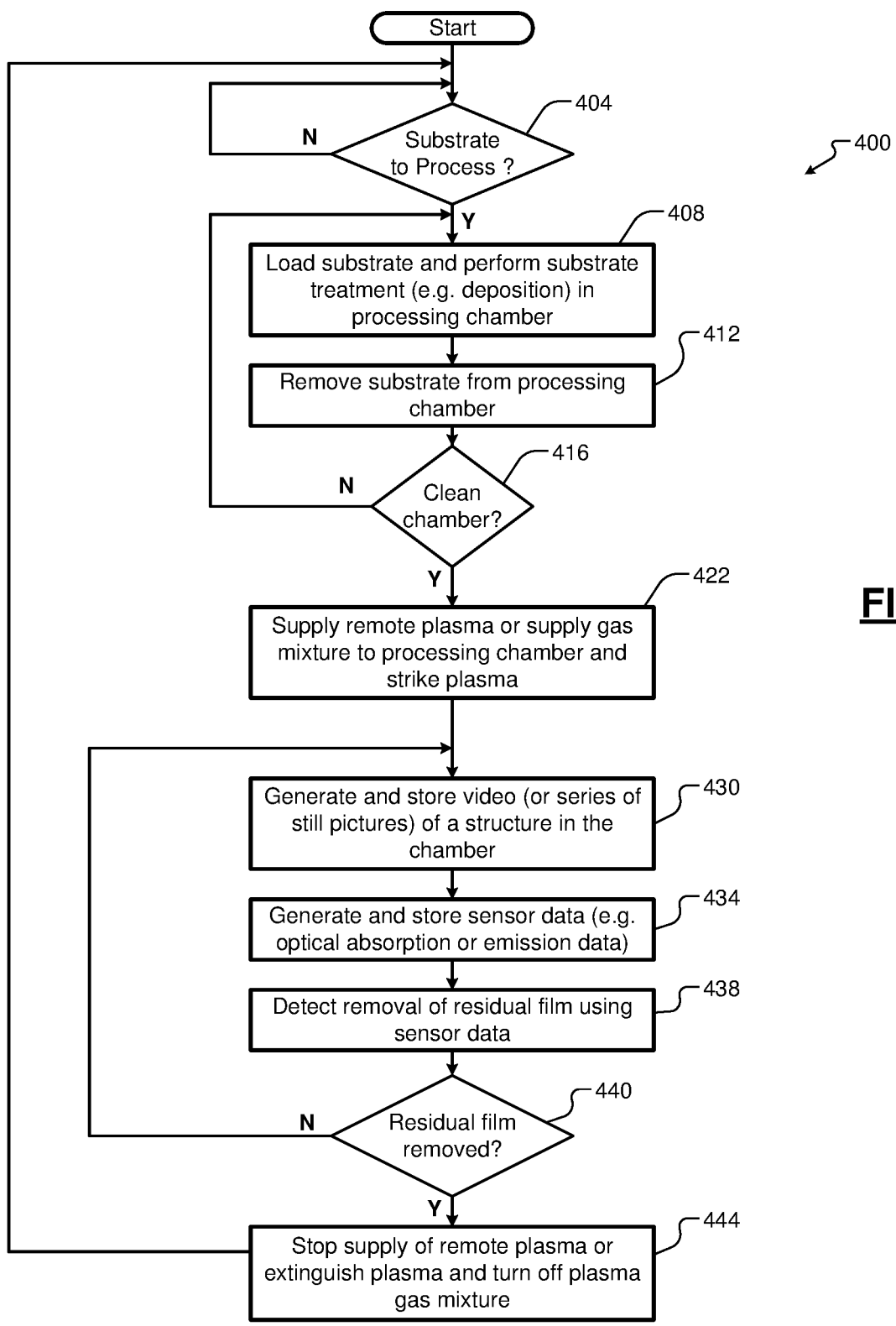
FIGS. 4-5 are flowcharts illustrating examples of methods for generating the learned model to identify the end point of residual film removal according to the present disclosure.
Figure 5:
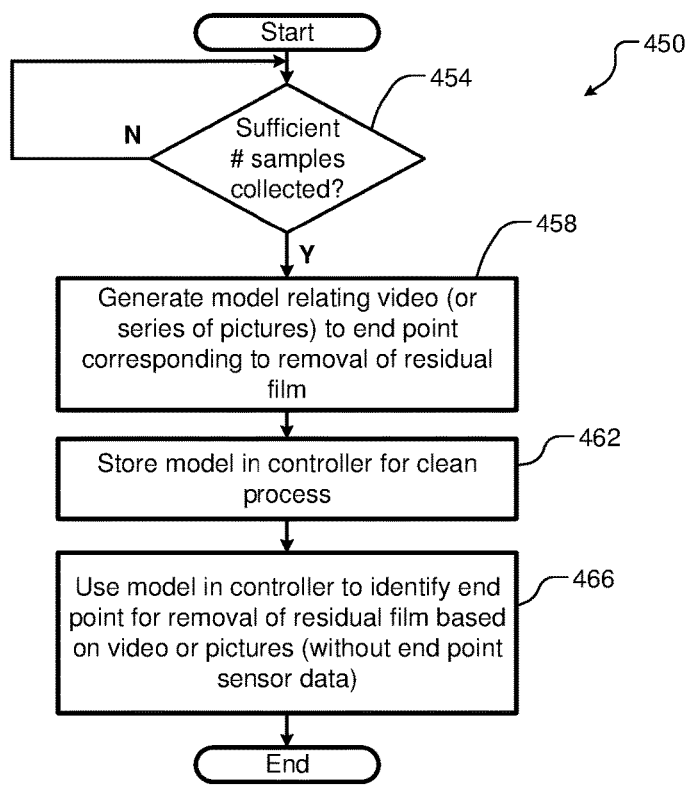

Referring now to FIGS. 4-5, methods for generating the learned model for the computer vision to identify the end point of residual film removal is shown. A method 400 for generating training data for generating a learned model (to be used by a computer vision system to detect the endpoint of residual film removal) is shown. At 404, the method determines whether a substrate needs to be processed. If 404 is true, the method continues at 408. At 408, the substrate is loaded into the processing chamber and a substrate treatment such as deposition is performed.

At 412, the substrate is removed from the processing chamber after the substrate treatment is performed. At 416, the method determines whether the chamber requires cleaning. If 416 is false, the method returns to 404. If 416 is true, the method supplies remote plasma or supplies a gas mixture to the processing chamber and strikes plasma at 422. The method generates and stores video signals of one or more structures in the processing chamber at 430. At 434, the method generates and stores chemical sensor data generated by the chemical sensor. At 438, the endpoint of the removal of residual film is detected using the chemical sensor. At 440, the method determines whether the residual film is removed. If 440 is false, the method returns to 430. If 440 is true, the method continues at 444 and stops the supply of remote plasma (or extinguishes the plasma and turns off the plasma gas mixture).

In FIG. 5, a method 450 for converting the training data generated in FIG. 4 into a learned model is shown. At 454, the method determines whether a sufficient number of training samples have been collected. At 458, the method generates the learned model relating the video signals to the endpoint of the residual film removal as determined by the chemical sensor. At 462, the model is stored in the controller for the cleaning process. At 466, the learned model is used by the controller to identify the endpoint for removal of residual film based on the video (or series of still pictures) without using a chemical sensor such as an absorption or RGA sensor.

Figure 6:
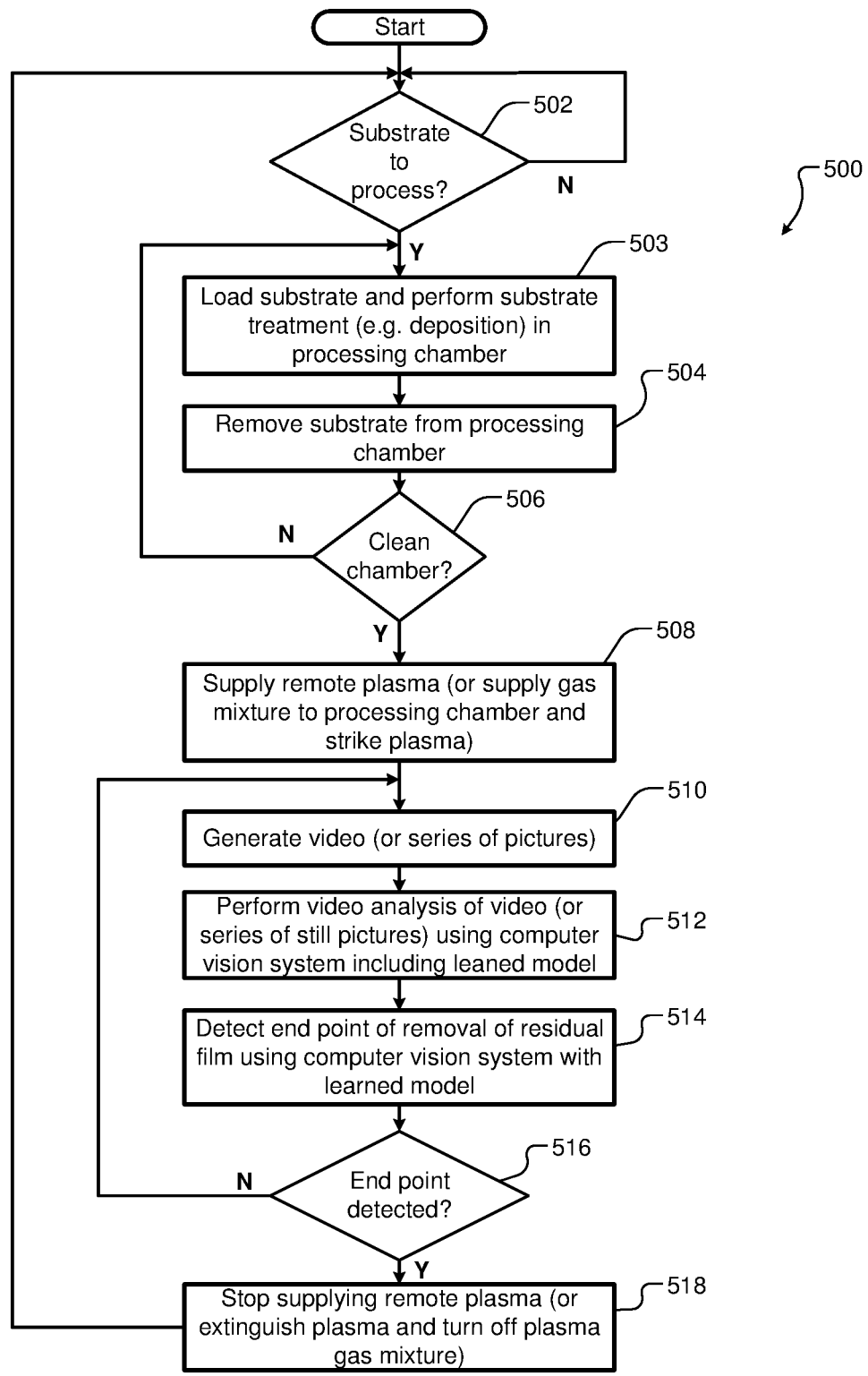
FIG. 6 is a flowchart illustrating an example of a method for using the learned model to detect the end point of residual film removal according to the present disclosure.

Referring now to FIG. 6, a method 500 for using a video signal and a computer vision system with a learned model to detect the endpoint of residual film removal is shown. At 502, if a substrate needs to be processed, the method continues at 503. At 503, the substrate is loaded into the processing chamber and a substrate treatment such as deposition is performed.

At 504, the substrate is removed from the processing chamber after the substrate treatment is performed. At 506, the method determines whether the chamber requires cleaning. If 506 is false, the method returns to 502. If 506 is true, the method continues at 508 and supplies remote plasma (or supplies a gas mixture to the processing chamber and strikes plasma). If in-situ plasma is used, a filter may be arranged between the video camera and the processing chamber.

At 510, video signals are generated during the cleaning process. At 512, the computer vision system performs video analysis of the video signals using the learned model. At 514, the computer vision system detects the endpoint of film removal using the learned model and the video signals. At 516, the method determines whether the endpoint has been detected. If 516 is false, the method returns to 510. When 516 is true, the method continues at 518 and stops supplying remote plasma (or extinguishes the plasma and turns off the plasma gas mixture). The method continues from 518 to 502.

Figure 7A:
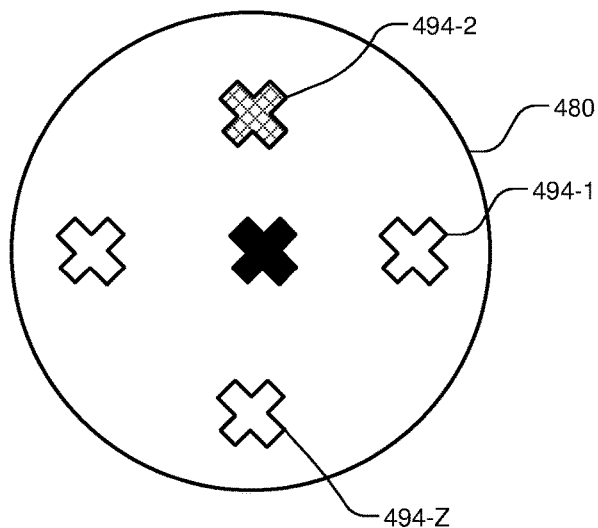
FIG. 7A is a plan view illustrating an example of a structure located in the processing chamber with markings to facilitate end point detection performed by the computer vision system according to the present disclosure.
Figure 7B:
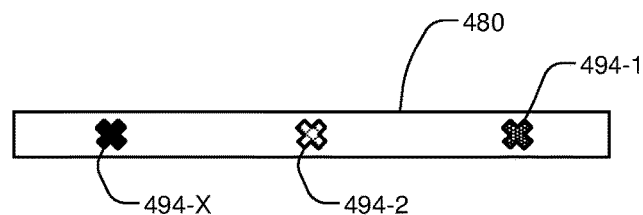
FIG. 7B is a side view illustrating an example of a structure in the processing chamber with markings to facilitate end point detection performed by the computer vision system according to the present disclosure.

Referring now to FIGS. 7A-7B, examples of markings are shown on structures arranged in the processing chamber to facilitate detection of the end point of residual film removal. In FIG. 7A, a structure 480 includes one or more markings 494-1, 494-2, . . . , and 494-Z, where Z is an integer greater than zero. In some examples, the markings may have different patterns, shading, colors or other designs to improve accuracy during detection by the computer vision system. In some examples, the structure 480 corresponds to an upper surface of the substrate support as shown in FIG. 7A. In other examples, the structure 480 corresponds to sides of the substrate support as shown in FIG. 7B. As can be appreciated, other components such as gas distribution devices, supports, sidewalls, etc. can also be marked in a similar fashion.

Figure 8:
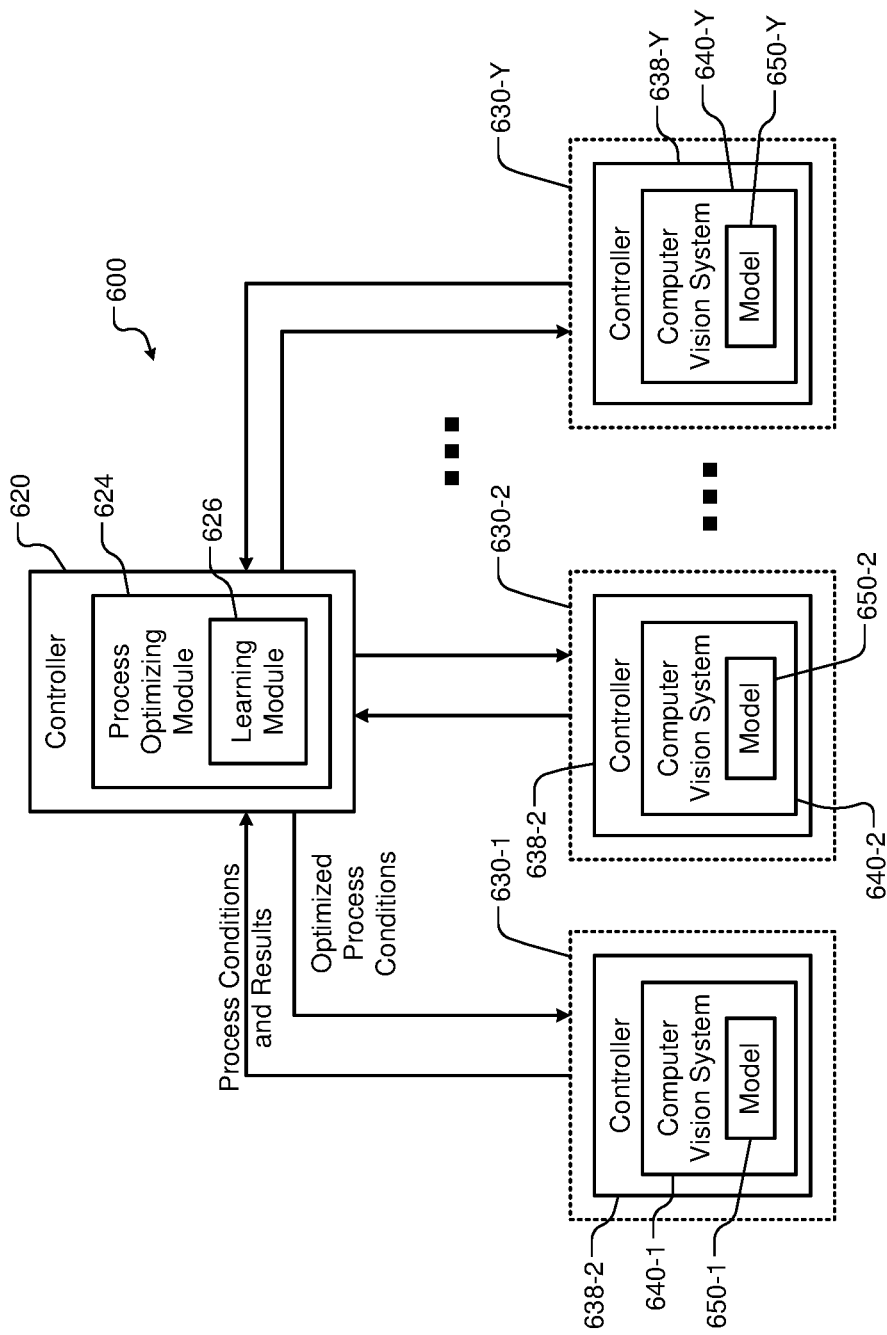
FIG. 8 is a functional block diagram of a system for optimizing process conditions using a controller connected to multiple process controllers including computer vision systems according to the present disclosure.

Referring now to FIG. 8, the computer vision systems and/or learned models may be used to optimize process parameters such as gas flows, gas species, gas composition or other parameters. An optimization system 600 includes a controller 620 including a process optimizing module 624 including a learning module 626. The controller 620 communicates with one or more processes 630-1, 630-2, ..., and 630-Y (where Y is an integer greater than zero). Each of the processes includes a controller 638-1, 638-2, ..., and 638-Y including a computer vision system 640-1, 640-2, ..., and 640-Y, respectively. In some examples, some of the computer vision systems 640-1, 640-2, ..., and 640-Y may further include a learned model 650-1, 650-2, ..., and 650-Y. The process optimizing module 624 receives a plurality of training sets including process conditions and results from the controllers 638-1, 638-2, ..., and 638-Y. The process optimizing module 624 optimizes process conditions for each of the controller 638-1, 638-2, ..., and 638-Y using a learned model, neural network or artificial intelligence implemented by the learning module 626.

The systems and methods for detecting the end point of residual film removal identifies features on a surface of one or more components in the processing chamber to determine the clean state of the processing chamber using an inexpensive camera. After sufficient training data, neural network (deep learning) models are used to change clean process parameters (such as pressure, flows, pedestal position, etc.) to allow chamber to chamber clean performance matching.

The systems and methods of the present disclosure can be used to compare performance of a process (e.g., a cleaning process, an etching process, a deposition process, etc.) across a plurality of processing chambers in a single tool or in several tools. Typically, processing chambers intended for a particular process such as etching or deposition process have similar design. Accordingly, the processes (e.g., cleaning, etching, deposition, etc.) performed in these processing chambers are expected to have similar performance (e.g., similar runtimes). That is, two identical processing chambers should perform the same process in the same manner. Stated differently, the performance of the same process in two similarly designed processing chambers should also be similar. The systems and methods of the present disclosure can analyze data collected from similarly designed processing chambers when a process is performed in these chambers. The systems and methods can then determine based on the analysis whether the performance of the process is similar across the processing chambers (i.e., if the processing chambers are matched and perform a process in the same manner).

Further, the analysis can help determine the performance of a process at component level. For example, in case of a cleaning process, the analysis can help determine whether the time taken by the cleaning process to clean a particular component is the same across a plurality of similarly designed processing chambers. This determination can be in addition to determining whether the overall runtime for the cleaning process is the same for each processing chamber.

Similar analyses can be performed to compare performance of other processes such as deposition and etching processes across multiple processing chambers. Based on the comparisons, any anomaly in the performance of a process in a particular chamber can be detected, and a cause for the anomaly can be corrected. For example, one processing chamber in a tool comprising multiple processing chambers may be cleaning faster than other processing chambers in the tool. The cleaning process for that processing chamber should be stopped earlier to prevent damage to that processing chamber. The processing chamber can be damaged if the cleaning process is continued further. However, if multiple processing chambers across a plurality of tools exhibit different cleaning times, the differing cleaning times of these processing chambers can indicate a need for a design change to these processing chambers to achieve chamber matching. Similar analyses can be performed for other processes such as deposition and etching processes to achieve chamber matching.

The systems and methods of the present disclosure can be used to determine various performance metrics for processes such as deposition and etching processes. For example, the performance metrics can include uniformity of etching across the wafer, uniformity of deposition across the wafer, uniformity of temperature across the wafer, and so on. For example, uniformity of film thickness can be determined during film deposition as well as film removal as described below. Notably, the systems and methods can make these determinations in situ (i.e., without removing the wafer from the processing chamber to a separate metrology chamber after the processing to make these determinations) and in real time (i.e., while the process is being performed on the wafer).

For example, during removal of a film from a wafer, the systems and methods can use techniques such as optical interference to observe the film in totality as the film gets thinner, and determine whether the film is completely removed, whether the removal is uniform across the wafer, and so on. For example, consider removal of copper oxide film from a wafer. Copper changes color on oxidation. Therefore, during copper oxide removal, the systems and methods of the present disclosure can observe changes in wavelengths of light reflected from the entire wafer as copper oxide is being removed and pure copper gets exposed. The changes in wavelengths can indicate status of copper oxide removal. Using an optical filter, the systems and methods can observe the changes locally on the wafer as well as across the entire wafer.

Without the ability to observe the entire wafer, only a single point on the wafer may be observed, and an erroneous conclusion may be drawn regarding the film removal from the entire wafer based on observing the single point on the wafer. For example, suppose that only the center of the wafer is observed and a determination is made that the copper oxide is removed from the center. Without the ability to observe the entire wafer, an erroneous conclusion may be drawn that the copper oxide from the entire wafer is removed although some copper oxide may be still not removed from the edges of the wafer. Instead, with the ability to observe the entire wafer, the systems and methods of the present disclosure can detect whether the film is being removed at a faster rate from the center of the wafer than at the edges of the wafer and whether the film is removed from the entire wafer. Further, these determinations are made in situ.

In another example, when a film is being grown on a wafer, often the film may take time to grow due to nucleation delay. Due to the ability to observe the entire wafer, the systems and methods of the present disclosure can detect whether the film is growing on a portion of the wafer before growing on another portion of the wafer. For example, the film growth (i.e., changes in film thickness due to growth) may be observed across the entire wafer using an ultraviolet filter. Further, the temperature of the wafer and changes therein may be observed using an infrared filter. The two observations (film thickness and wafer temperature) made using the two filters (ultraviolet and infrared) may be correlated to determine the uniformity of film growth across the entire wafer. Notably, this determination is made in situ in real time in the processing chamber without removing the wafer to a separate metrology chamber.

Further, the systems and methods of the present disclosure can monitor the edges of a wafer. For example, by focusing the camera on the top edge of the wafer, the systems and methods can determine whether the wafer is processed (e.g., cleaned, etched, etc.) up to the edge of the wafer. Again, this is done in situ and not after the fact by removing the wafer to a separate metrology chamber. This ability to monitor the wafer edges while the process is being performed on the wafer can help save processing time and process material by discontinuing the process as soon as the determination is made, based on observing the edges, that the process has been completed to the edge of the wafer.

Further, in some instances, deposition can be performed on both top and bottom surfaces of a wafer. The systems and methods of the present disclosure can be used to observe the deposition process on both top and bottom surfaces of a wafer. For example, fiber optic probes and/or microscopic lenses can be used in conjunction with the systems and methods of the present disclosure to view a large area of the bottom portion of the wafer and obtain an image thereof. In some instances, one or more LED's can be installed in the processing chamber to illuminate the bottom portion of the wafer. The captured image can be processed and analyzed to determine the uniformity of deposition across the entire bottom portion of the wafer. For example, the processed images can be correlated to actually measured deposition levels (the measurements having been made previously), and the correlations can then be used to infer deposition levels and uniformity in situ.

The systems and methods of the present disclosure can also be used to measure a gap between a showerhead and a pedestal in a processing chamber. For example, two cameras can be respectively focused on the showerhead and the pedestal, and video signals from the two cameras can be used to determine the distance between the showerhead and the pedestal. The measurement can then be used to control (vary) the gap between the showerhead and the pedestal (e.g., by controlling an apparatus that moves the pedestal relative to the showerhead).

Further, in some processing chambers, parasitic plasma can linger in the processing chamber after the plasma has been extinguished. The parasitic plasma is undesirable and difficult to detect. The camera(s) of the systems and methods of the present disclosure can be used to detect the parasitic plasma. Many other applications of the systems and methods of the present disclosure are contemplated and are within the scope of the present disclosure.

Figure 9:
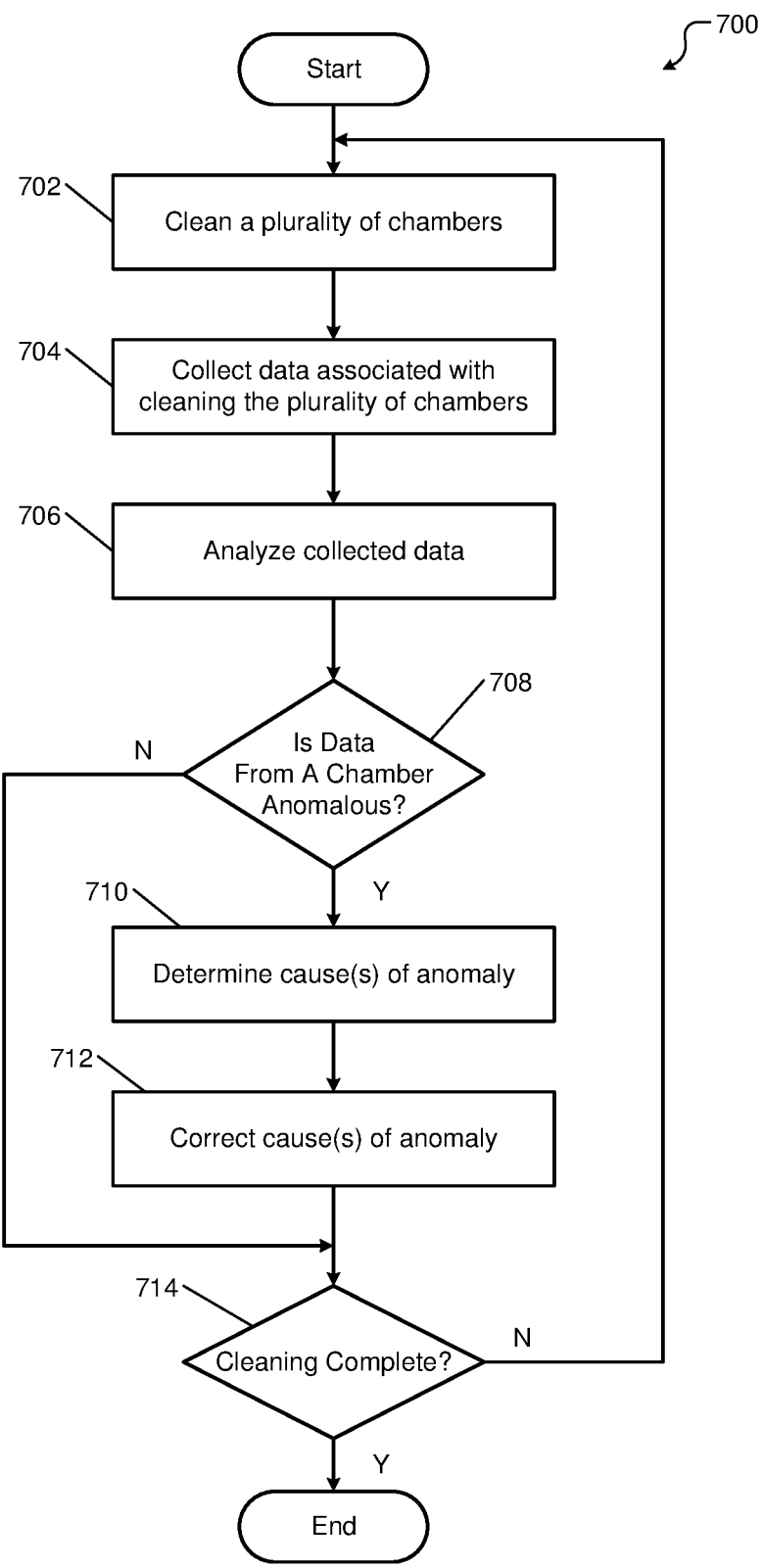
FIG. 9 is a flowchart illustrating an example of a method for comparing performance of a process performed in a plurality of chambers and matching the processing chambers based on performance of the process in the plurality of chambers according to the present disclosure.

FIG. 9 shows a method 700 for chamber matching according to the present disclosure. A cleaning process is used for example only. The teachings of the method 700 can also be used with a deposition or etching process. At 702, the method 700 begins a cleaning process to clean a plurality of chambers. At 704, the method 700 collects data associated with cleaning the plurality of chambers. At 706, the method 700 analyzes the collected data. At 708, the method 700 determines if data from one of the plurality of chambers is anomalous. For example, the method 700 determines if one of the plurality of chambers has a shorter run time for the cleaning process (i.e., cleans faster) than the rest of the plurality of chambers. At 710, if an anomaly is detected, the method 700 determines a cause or causes of the anomaly associated with the one of the chambers. At 712, the method 700 corrects the cause or causes of the anomaly. Thereafter, or if an anomaly is not detected at 708, at 714, the method 700 determines if all the chambers are clean or if the cleaning process should continue (i.e., if the cleaning process is not yet complete). The method 700 returns to 702 if all the chambers are not yet clean (i.e., if the cleaning process should not yet be terminated).

Figure 10:
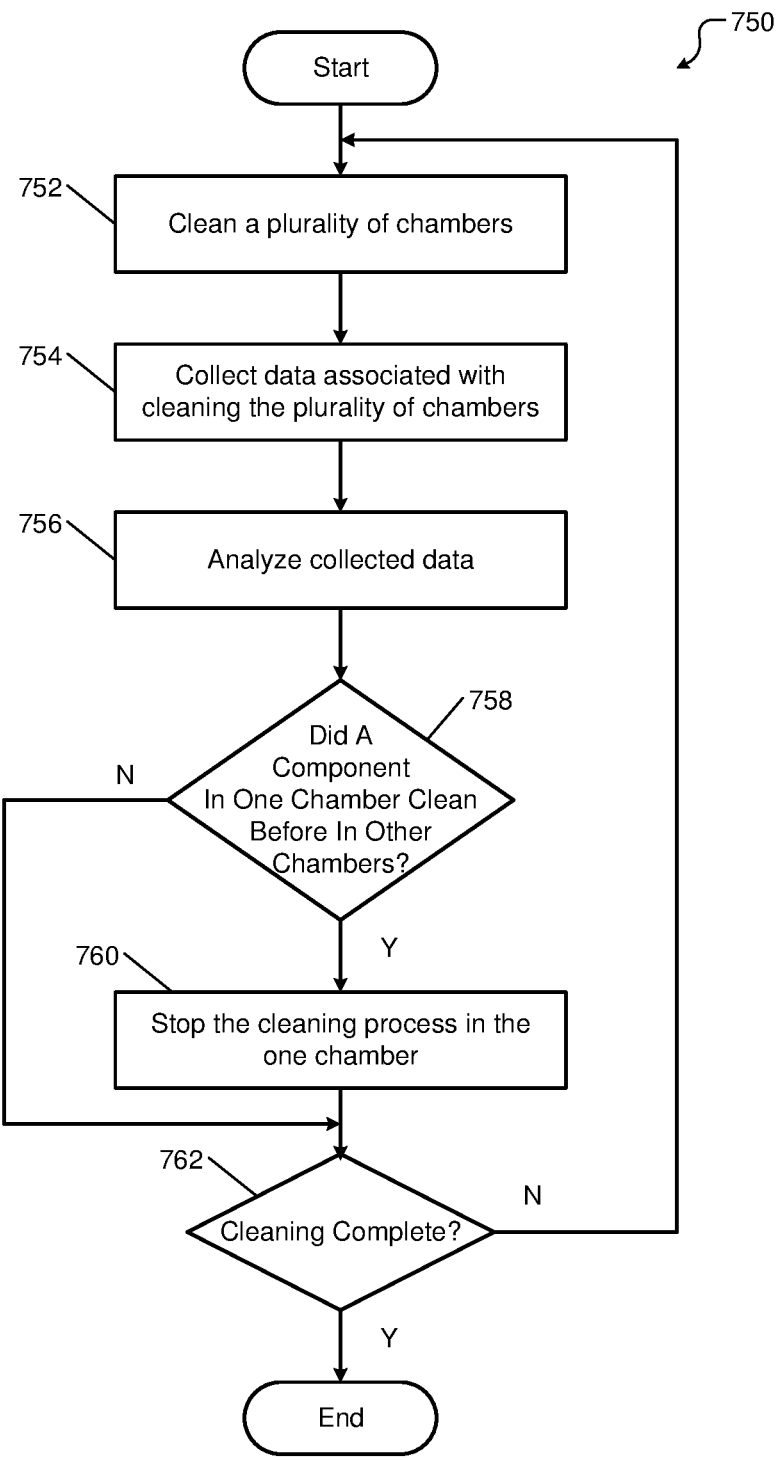
FIG. 10 is a flowchart illustrating an example of a method for matching processing chambers at component level according to the present disclosure.

FIG. 10 shows a method 750 for matching processing chambers at component level according to the present disclosure. Again, a cleaning process is used for example only. The teachings of the method 750 can also be used with a deposition or etching process. At 752, the method 750 begins a cleaning process to clean a plurality of chambers. At 754, the method 750 collects data associated with cleaning the plurality of chambers. At 756, the method 750 analyzes the collected data. At 758, the method 750 determines if a component in one of the chambers cleans before (i.e., faster than) the same component cleans in the other chambers. At 760, if a component in one of the chambers cleans before (i.e., faster than) the same component cleans in the other chambers, the method 750 stops the cleaning process in that chamber. Thereafter, or if a component in one of the chambers does not clean before (i.e., faster than) the same component cleans in the other chambers, at 762, the method 750 determines if all the chambers are clean or if the cleaning process should continue (i.e., if the cleaning process is not yet complete). The method 750 returns to 752 if all the chambers are not yet clean (i.e., if the cleaning process should not yet be terminated).

Figure 11A:
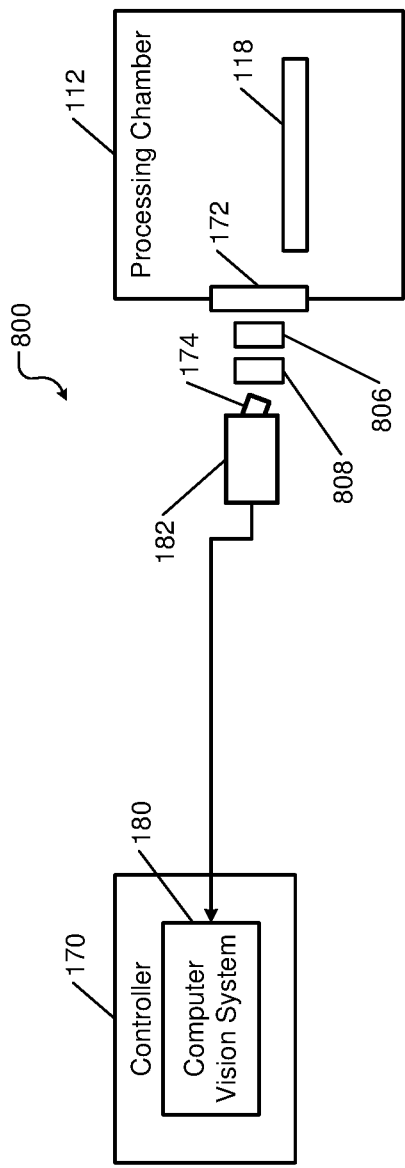
FIG. 11A is a schematic of a system for determining uniformity of a film being deposited on a substrate according to the present disclosure.

FIG. 11A shows a schematic of a system 800 for determining uniformity of a film being deposited on a substrate according to the present disclosure. The system 800 comprises the processing chamber 112 that processes (e.g., deposits material on) on the substrate 118. The processing chamber 112 includes the window 172. The system 800 comprises the controller 170 including the computer vision system 180, the camera 174, and the camera positioning device 182.

The system 800 additionally comprises an ultraviolet filter 806 and an infrared filter 808. The ultraviolet filter 806 and the infrared filter 808 are arranged between the camera 174 and the window 172. The ultraviolet filter 806 filters wavelengths of ultraviolet light received from the substrate 118 through the window 172. The infrared filter 808 filters wavelengths of infrared light received from the substrate 118 through the window 172.

The computer vision system 180 receives the outputs of the ultraviolet filter 806 and the infrared filter 808. The computer vision system 180 determines a thickness of material being deposited at a plurality of locations on the substrate 118 based on the output of the ultraviolet filter 806. The computer vision system 180 determines a temperature of the substrate 118 at the plurality of locations based on the output of the infrared filter 808. The computer vision system 180 correlates the determinations of the thickness and the temperature and determines a uniformity of deposition across an entirety of the substrate 118 based on the correlation.

Figure 11B:
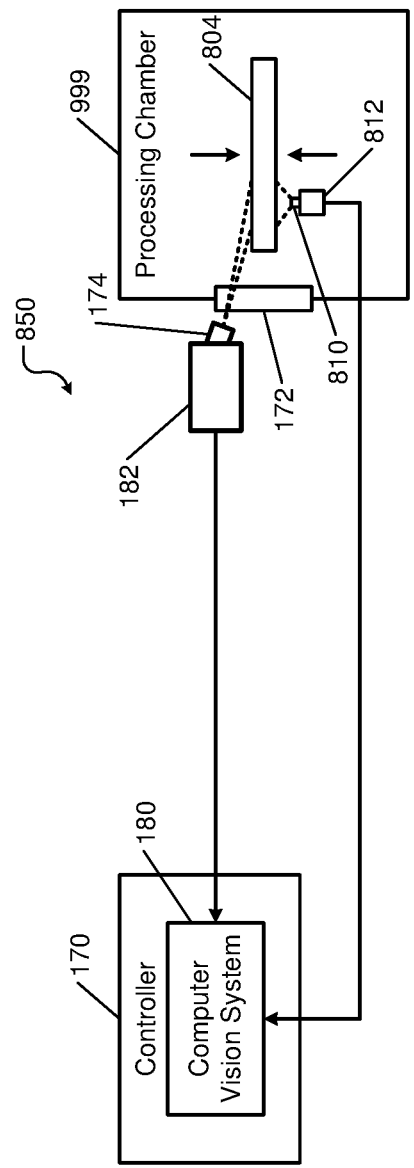
FIG. 11B is a schematic of a system for determining whether material is being deposited uniformly on both top and bottom portions of a substrate according to the present disclosure.

FIG. 11B shows a schematic of a system 850 for determining whether material is being deposited uniformly on both top and bottom portions of a substrate according to the present disclosure. The system 850 comprises a processing chamber 999 that processes (e.g., deposits material on) both upper and lower sides (identified by arrows) of a substrate 804. The processing chamber 802 includes the window 172. The details of depositing material on both sides of the substrate 804 (e.g., using CVD) are not relevant to the present disclosure and are therefore not shown and described. The system 850 comprises the controller 170 including the computer vision system 180, the camera 174, and the camera positioning device 182.

The system 850 additionally comprises an optical sensor 810 (e.g., a fiber optics sensor or a micro lens) to view a bottom portion of the substrate 804. A sensor positioning device 812 positions the optical sensor 810 to point at various locations at the bottom portion of the substrate 804.

The computer vision system 180 focuses the camera 174 at a top portion of the substrate 804. The computer vision system 180 receives images of the top portion of the substrate 804 from the camera 174. The computer vision system 180 positions the optical sensor 810 to view a bottom portion of the substrate 804. The computer vision system 180 receives images of the bottom portion of the substrate 804 from the optical sensor 810. The computer vision system 180 processes the images received from the camera 174 and the optical sensor 810. The computer vision system 180 determines uniformity of deposition across the entire top portion and the entire bottom portion of the substrate 804 based on the processing of the images received from the camera 174 and the optical sensor 810.

Figure 12:
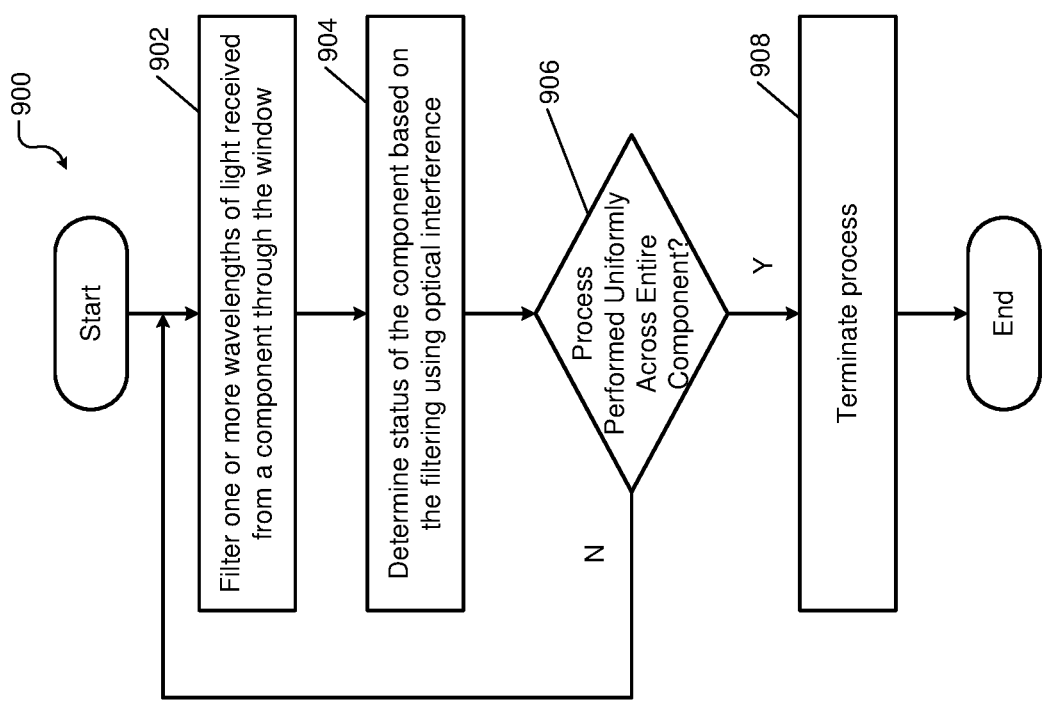
FIG. 12 is a flowchart illustrating an example of a method for determining whether a process (e.g., cleaning, etching, deposition, etc.) being performed on a component has been performed uniformly across the entire component according to the present disclosure.

FIG. 12 shows a method 900 for determining whether a process (e.g., cleaning, etching, deposition, etc.) being performed on a component has been performed uniformly across the entire component according to the present disclosure. At 902, the method 900 filters one or more wavelengths of light received from a component (e.g., a wafer) through a window provided on a processing chamber in which the component is being processed. At 904, the method 900 determines the status of the component based on the filtering using optical interference. At 906, the method 900 determines based on the status of the component whether the process has been performed uniformly across the entire component. At 908, the method 900 terminates the process if the process has been performed uniformly across the entire component. The method 900 returns to 902 if the process has not been performed uniformly across the entire component.

Figure 13:
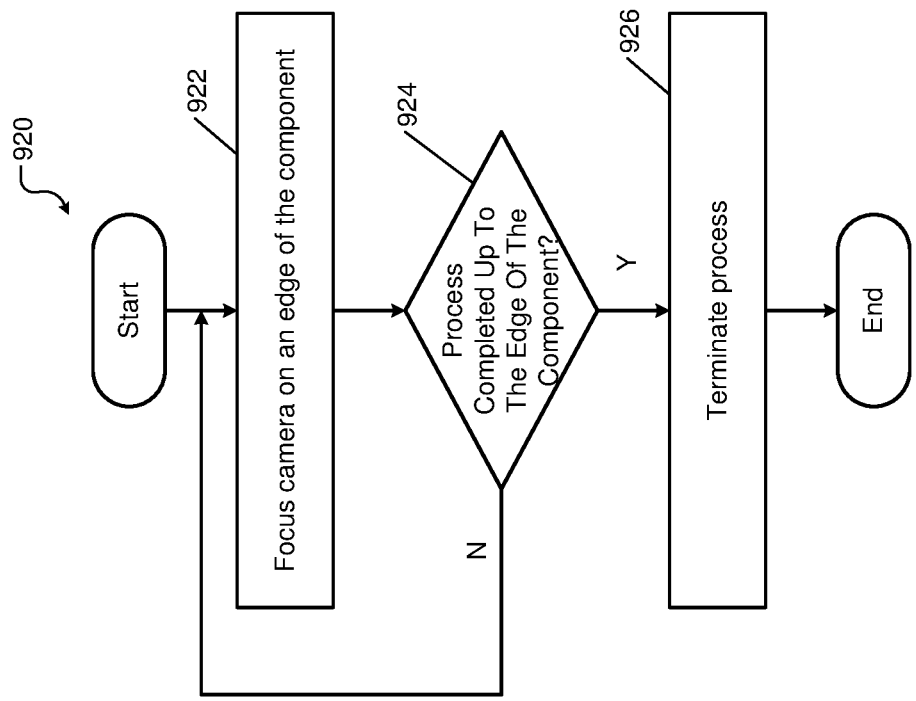
FIG. 13 is a flowchart illustrating an example of a method for determining whether a process (e.g., cleaning, etching, deposition, etc.) being performed on a component has been performed up to the edge of the component according to the present disclosure.

FIG. 13 shows a method 920 for determining whether a process (e.g., cleaning, etching, deposition, etc.) being performed on a component has been performed up to the edge of the component according to the present disclosure. At 922, the method 920 focuses the camera on the edge of the component (e.g., a wafer). At 924, the method 920 determines whether the process has been completed up to the edge of the component. At 926, the method 920 terminates the process if the process has been completed up to the edge of the component. The method 920 returns to 922 if the process has not been completed up to the edge of the component.

Figure 14:
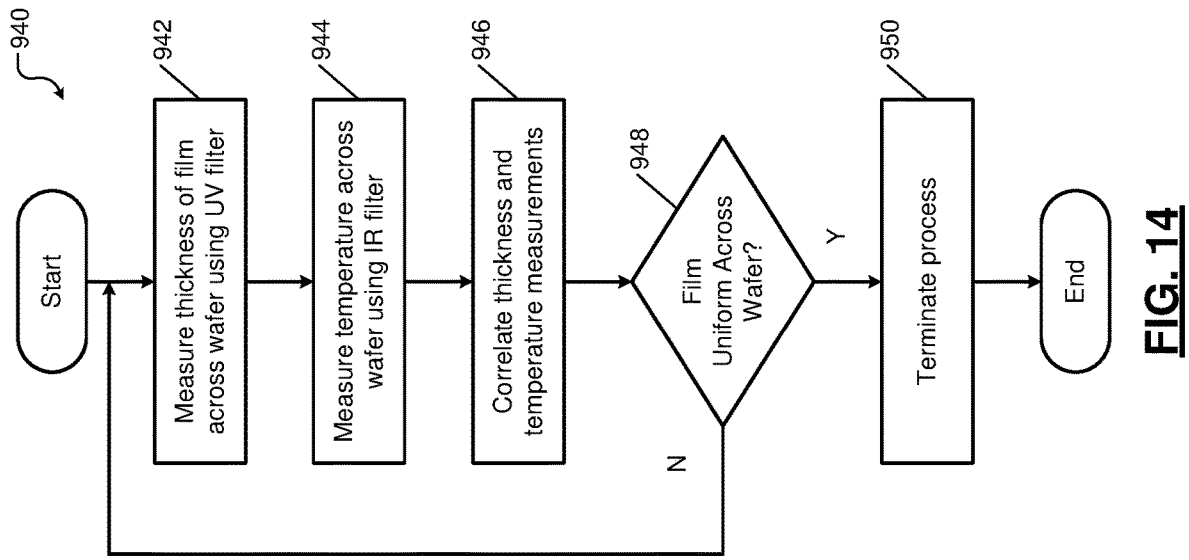
FIG. 14 is a flowchart illustrating an example of a method for determining uniformity of a film being deposited on a substrate according to the present disclosure.

FIG. 14 shows a method 940 for determining uniformity of a film being deposited on a substrate according to the present disclosure. At 942, the method 940 measures the thickness of the film across the substrate using an ultraviolet filter as explained with reference to FIG. 11A. At 944, the method 940 measures the temperature across the substrate using an infrared filter as explained with reference to FIG. 11A. At 946, the method 940 correlates the thickness and temperature measurements. At 948, the method 940 determines based on the measurements whether the film has been deposited uniformly across the substrate. At 950, the method 940 terminates the deposition process if the film has been deposited uniformly across the substrate. The method 940 returns to 942 if the film has not yet been deposited uniformly across the substrate.

Figure 15:
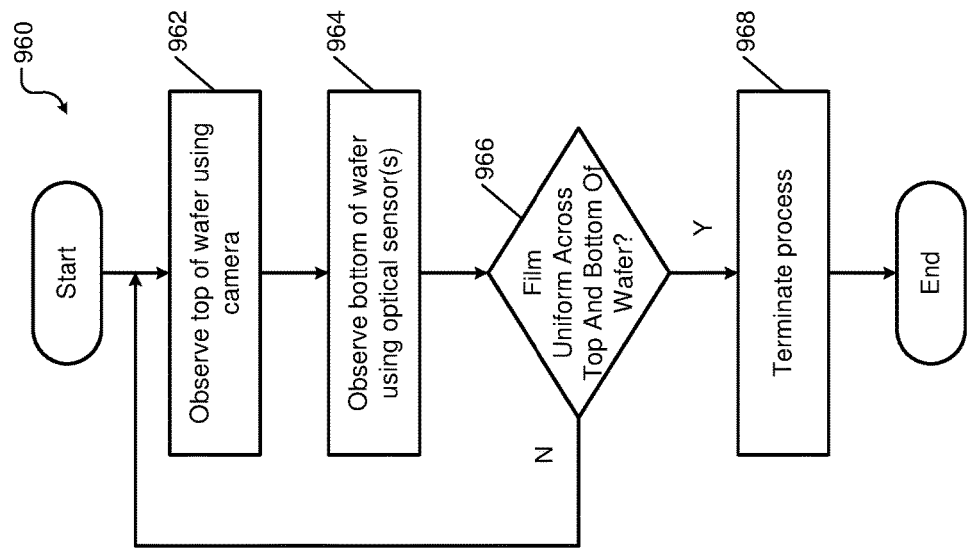
FIG. 15 is a flowchart illustrating an example of a method for determining whether material is being deposited uniformly on both top and bottom portions of a substrate according to the present disclosure.

FIG. 15 shows a method 960 for determining whether material is being deposited uniformly on both top and bottom portions of a substrate according to the present disclosure. At 962, the method 960 observes the top portion of the substrate using the camera as described with reference to FIG. 11B. At 964, the method 960 observes the bottom portion of the substrate using one or more optical sensors as described with reference to FIG. 11B. At 966, the method 960 determines whether the film is deposited uniformly across the top and bottom portions of the substrate as described with reference to FIG. 11B. At 968, the method 960 terminates the deposition process if the film has been deposited uniformly across the top and bottom portions of the substrate. The method 960 returns to 962 if the film has not yet been deposited uniformly across the top and bottom portions of the substrate.

The above methods are described separately for clarity only. One or more of the above methods can be combined in whole or in part and can be performed together.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system comprising:
   a camera mounted external to and adjacent to a window of a processing chamber configured to process semiconductor substrates, the window allowing the camera to view a component in the processing chamber, the camera configured to generate a video signal indicative of a status of the component during a process being performed in the processing chamber; and
   a controller coupled to the processing chamber and configured to:
   control the camera;
   process the video signal from the camera;
   determine the status of the component based on the processing of the video signal; and
   determine whether to terminate the process based on the status of the component.

2. The system of claim 1 wherein in response to the process being a cleaning process performed to remove material deposited on the component by a previously performed process, the controller is configured to:
   compare a change in an attribute of a feature of the component observed over a plurality of frames of the video signal to a predetermined threshold;
   determine, based on the comparison, whether the material deposited on the component is removed; and
   terminate the cleaning process in response to determining that the material deposited on the component is removed.

3. The system of claim 1 wherein in response to the process being a cleaning process performed to remove material deposited on the component by a previously performed process, the controller is configured to:
   compare an image captured from the video signal to a predetermined image;
   determine, based on the comparison, whether the material deposited on the component is removed; and
   terminate the cleaning process in response to determining that the material deposited on the component is removed.

4. The system of claim 1 wherein the controller is configured to:
   receive data from one or more sensors in the processing chamber;
   generate a model based on the data received from one or more sensors and video signals received from the camera, the video signals indicating the status of the component while the process is previously performed in the processing chamber; and use the model to:
  process the video signal;
  determine the status of the component based on the processing of the video signal; and
  determine whether to terminate the process based on the determined status of the component.

5. The system of claim 1 further comprising:
an optical filter arranged between the camera and the window, the optical filter configured to filter one or more wavelengths of light received from the component through the window and to output a filtered signal to the camera,
wherein the controller is configured to determine the status of the component based on processing the filtered signal using optical interference.

6. The system of claim 5 wherein the controller is configured to determine whether the process is performed across an entirety of the component prior to terminating the process.

7. The system of claim 5 wherein the controller is configured to determine whether the process is performed uniformly across an entirety of the component prior to terminating the process.

8. The system of claim 5 wherein the controller is configured to determine a rate at which the process is being performed at different locations on the component.

9. The system of claim 1 wherein the component includes a semiconductor substrate and the process includes a film removal process performed to remove a film from the semiconductor substrate, and wherein the controller is configured to determine whether film is removed across an entirety of the component prior to terminating the process.

10. The system of claim 1 wherein the controller is configured to focus the camera at an edge of the component and to determine whether the process is performed at the edge of the component prior to terminating the process.

11. The system of claim 1 wherein the component includes a semiconductor substrate and the process includes a deposition process, the system further comprising:
  a first optical filter arranged between the camera and the window, the first optical filter being configured to filter wavelengths of ultraviolet light received from the component through the window; and
  a second optical filter arranged between the camera and the window, the second optical filter being configured to filter wavelengths of infrared light received from the component through the window;
  wherein the controller is configured to:
    determine a thickness of material being deposited at a plurality of locations on the component based on an output of the first optical filter;
    determine a temperature of the component at the plurality of locations based on an output of the second optical filter;
    correlate the determinations of the thickness and the temperature; and
    determine a uniformity of deposition across an entirety of the component based on the correlation.

12. The system of claim 1 wherein the component includes a semiconductor substrate and the process includes a deposition process, the system further comprising:
  an optical sensor configured to view a bottom portion of the component,
  wherein the controller is configured to:
    focus the camera at a top portion of the component;
    process images received from the optical sensor and the camera; and
    determine uniformity of deposition across entireties of the top portion and the bottom portion of the component based on the processing of the images.

13. The system of claim 1 further comprising:
a second controller coupled to a second processing chamber in which the same process is performed, the second controller configured to control a second camera associated with the second processing chamber; and
a third controller configured to:
  analyze data from the controller and the second controller;
  compare, based on the analyzed data, the performance of the process in the processing chamber to the performance of the process in the second processing chamber; and
  determine, based on the comparison, whether the performance of the process in the processing chamber matches the performance of the process in the second processing chamber.

14. The system of claim 1 further comprising:
a second controller coupled to a second processing chamber in which the same process is performed on the same component, the second controller configured to control a second camera associated with the second processing chamber; and
a third controller configured to:
  analyze data from the controller and the second controller;
  compare, based on the analyzed data, the performance of the process on the component in the processing chamber and in the second processing chamber; and
  determine, based on the comparison, whether the performance of the process on the component in the processing chamber matches the performance of the process on the component in the second processing chamber.

15. The system of claim 14 wherein in response to the process in the processing chamber finishing earlier than in the second processing chamber, the third controller is configured to terminate the process in the processing chamber earlier than in the second processing chamber.

* * * * *